(12) United States Patent
Yamamoto et al.

(10) Patent No.: US 12,389,726 B2
(45) Date of Patent: Aug. 12, 2025

(54) DETECTING DEVICE AND MEASURING DEVICE

(71) Applicant: SEIKO EPSON CORPORATION, Tokyo (JP)

(72) Inventors: Tetsuya Yamamoto, Suwa (JP); Takefumi Fukagawa, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 765 days.

(21) Appl. No.: 17/586,771

(22) Filed: Jan. 27, 2022

(65) Prior Publication Data

US 2022/0246806 A1 Aug. 4, 2022

(30) Foreign Application Priority Data

Jan. 29, 2021 (JP) ................. 2021-013632

(51) Int. Cl.
*H10H 20/85* (2025.01)
*H10H 20/81* (2025.01)
(Continued)

(52) U.S. Cl.
CPC ...... *H10H 20/8514* (2025.01); *H10H 20/813* (2025.01); *H10H 20/8515* (2025.01); *H10H 20/856* (2025.01)

(58) Field of Classification Search
CPC ............... H01L 33/08; H01L 31/02162; H01L 31/02164; H01L 25/167; A61B 5/024; A61B 5/14551
See application file for complete search history.

(56) References Cited

U.S. PATENT DOCUMENTS 11,062,116 B2 7/2021 Yun et al.
2005/0253047 A1* 11/2005 Maegawa ............ A61B 5/681
250/221
(Continued)

FOREIGN PATENT DOCUMENTS

CN 111315280 6/2020
JP 2005323906 11/2005
(Continued)

*Primary Examiner* — Joshua Benitez Rosario
*Assistant Examiner* — Moataz Khalifa
(74) *Attorney, Agent, or Firm* — JCIPRNET

(57) ABSTRACT

A detecting device includes: a first light-emitting section configured to emit first light having a green wavelength band; a second light-emitting section configured to emit second light having a wavelength band longer than the green wavelength band; a first light-receiving section configured to receive the first light emitted from the first light-emitting section and passed through a living body; and a second light-receiving section configured to receive the second light emitted from the second light-emitting section and passed through the living body. In the direction intersecting the direction in which the first light-emitting section and the second light-emitting section are aligned, in the second direction, at least a portion of the first light-receiving section is disposed closer to the first light-emitting section than the second light-receiving section. An area of the first light-receiving section is smaller than an area of the second light-receiving section.

10 Claims, 5 Drawing Sheets

(51) Int. Cl.
*H10H 20/813* (2025.01)
*H10H 20/851* (2025.01)
*H10H 20/856* (2025.01)

(56) References Cited

U.S. PATENT DOCUMENTS

| | | | |
|---|---|---|---|
| 2016/0198966 | A1 | 7/2016 | Uematsu et al. |
| 2016/0367144 | A1 | 12/2016 | Matsuo |
| 2019/0130156 | A1 | 5/2019 | Yun et al. |

FOREIGN PATENT DOCUMENTS

| | | | | |
|---|---|---|---|---|
| JP | 2016165331 | | 9/2016 | |
| JP | 2016165331 A | * | 9/2016 | ......... A61B 5/02427 |
| JP | 2018-061675 | | 4/2018 | |
| JP | 2018061675 A | * | 4/2018 | |
| KR | 20190049025 A | * | 5/2019 | |
| WO | WO-2015136882 A1 | * | 9/2015 | ........... A61B 5/0059 |
| WO | WO-2020198089 A1 | * | 10/2020 | ........... A61B 5/1118 |

\* cited by examiner

DETECTING DEVICE AND MEASURING DEVICE

The present application is based on, and claims priority from JP Application Serial Number 2021-013632, filed Jan. 29, 2021, the disclosure of which is hereby incorporated by reference herein in its entirety.

BACKGROUND

1. Technical Field

The present disclosure relates to a detecting device and a measuring device.

2. Related Art

Various measurement technologies for non-invasively measuring biological information such as pulse waves have been proposed in the past. For example, JP-A-2018-061675 discloses a detecting device that includes a light-emitting section configured to emit light to a living body, and a light-receiving section configured to receive light emitted from the light-emitting section and reflected by the living body to be incident on the light-receiving section. JP-A-2018-061675 discloses a technology whereby the light utilization efficiency of the light-emitting section is increased and a measure against stray light for the light-receiving section is implemented by installing a light-shielding member between the light-emitting section and the light-receiving section in the detecting device.

The above-described detecting device reflects light by an inclined surface formed on the light-shielding member, thereby improving the light utilization efficiency of the light-emitting section. However, there is a problem in that the device configuration cannot be downsized because space is needed for providing the inclined surface on the light-shielding member.

SUMMARY

According to one aspect of the present disclosure, there is provided a detecting device including: a first light-emitting section configured to emit first light having a green wavelength band, a second light-emitting section configured to emit second light having a wavelength band longer than the green wavelength band, a first light-receiving section configured to receive the first light emitted from the first light-emitting section and emitted from a living body, and a second light-receiving section configured to receive the second light emitted from the second light-emitting section and emitted from the living body, when a direction in which the first light-emitting section and the second light-emitting section are aligned is a first direction and a direction intersecting the first direction is a second direction, in the second direction, at least a portion of the first light-receiving section being disposed closer to the first light-emitting section than the second light-receiving section and an area of the first light-receiving section being smaller than an area of the second light-receiving section.

According to one aspect of the present disclosure, there is provided a measuring device including: a detecting device according to the above-described aspect, and an information analysis section configured to identify biological information from a detection signal indicating a detection result by the detecting device.

DESCRIPTION OF EXEMPLARY EMBODIMENTS

Hereinafter, one embodiment of the present disclosure will be described with reference to the accompanying drawings. Note that in each of the figures below, to illustrate each member at a recognizable size, the scale or angle of each member is changed from the actual scale or angle.

First Embodiment

Figure 1:
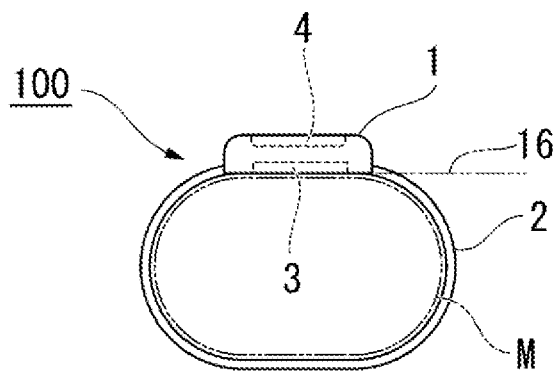
FIG. 1 is a side view of a measuring device according to a first embodiment.

FIG. 1 is a side view of a measuring device 100 according to a first embodiment. The measuring device 100 according to the present embodiment illustrated in FIG. 1 is a biometric instrument that non-invasively measures biological information of a test subject (e.g., a human), which is an example of a living body. The measuring device 100 is mounted at a site (hereinafter referred to as the "measurement site") M that serves as a measurement target of the body of a test subject. The measuring device 100 according to the present embodiment is a wristwatch-type portable instrument including a housing section 1 and a belt 2. The measuring device 100 is mountable to a wrist of the test subject by winding a band-shaped belt 2 around a wrist, which is an example of a measurement site (living body) M. In the present embodiment, pulse waves (e.g., pulse peak interval or PPI) and oxygen saturation (SpO2) of the test subject are used as examples of biological information. A pulse wave means temporal change in blood vessel volume linked to the beats of the heart. Oxygen saturation means a percentage (%) of hemoglobin bound to oxygen in total hemoglobin in the blood of the test subject. Oxygen saturation is an indicator for assessing the respiratory function of the test subject.

Figure 2:
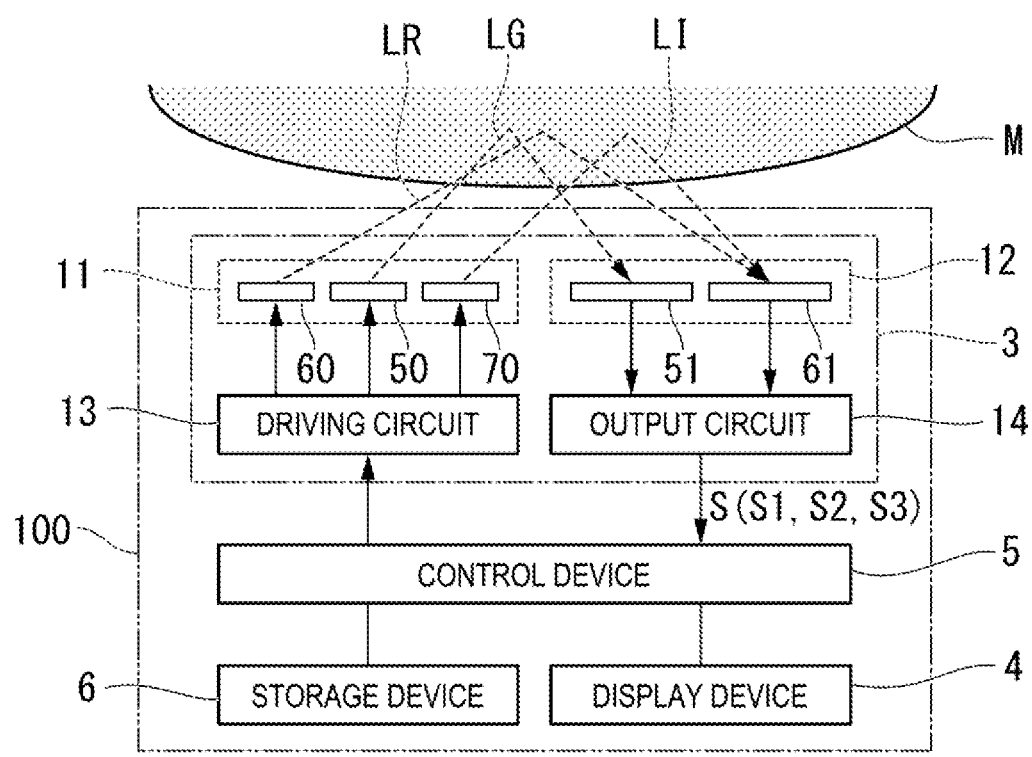
FIG. 2 is a configuration diagram focused on a function of a measuring device.

FIG. 2 is a configuration diagram focused on a function of the measuring device 100. As illustrated in FIG. 2, the measuring device 100 according to the present embodiment includes a control device 5, a storage device 6, a display device 4, and a detecting device 3. The control device 5 and the storage device 6 are installed inside the housing section 1. As illustrated in FIG. 1, the display device 4 is installed on a surface of the housing section 1 on a side opposite to the measurement site M. The display device 4 displays various images including measurement results under the control of the control device 5. The display device 4 is, for example, a liquid crystal display panel.

The detecting device 3 is an optical sensor module that generates a detection signal S in accordance with the state of the measurement site M. As illustrated in FIG. 1, the detecting device 3 is installed, for example, on a surface (hereinafter referred to as the detection surface) 16 of the housing section 1 that faces the measurement site M. The detection surface 16 is a surface that comes into contact with the measurement site M. As illustrated in FIG. 2, the detecting device 3 according to the present embodiment includes a light-emitting unit section 11, a light-receiving unit section 12, a driving circuit 13, and an output circuit 14. Note that one or both of the driving circuit 13 and the output circuit 14 may be installed as an external circuit of the detecting device 3. That is, the driving circuit 13 and the output circuit 14 can be omitted from the detecting device 3.

Figure 3:
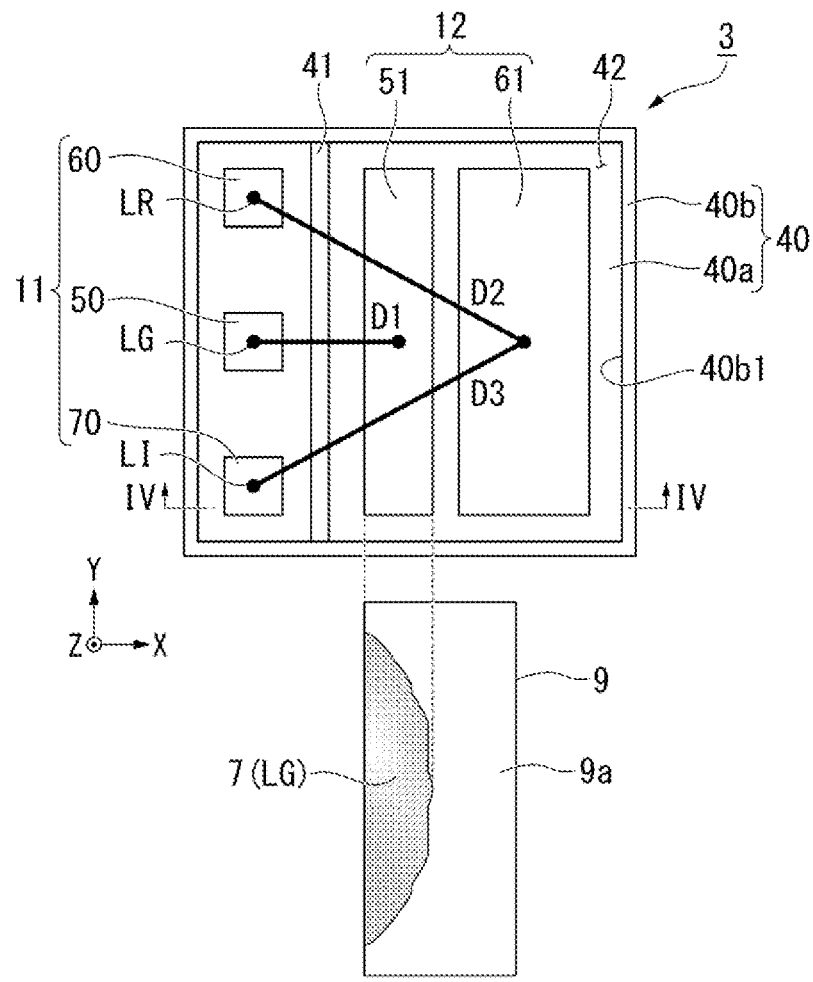
FIG. 3 is a plan view of a detecting device.
Figure 4:
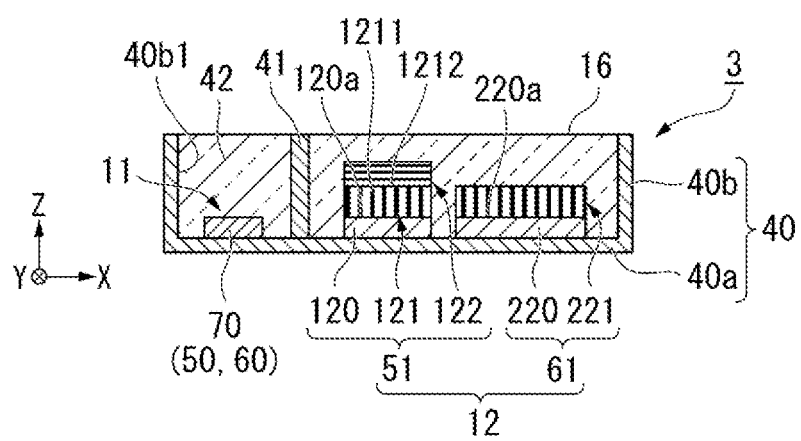
FIG. 4 is a cross-sectional view taken along the line IV-IV in FIG. 3.

FIG. 3 is a plan view of the detecting device 3. FIG. 4 is a cross-sectional view taken along the line IV-IV in FIG. 3. As illustrated in FIG. 3 and FIG. 4, the detecting device 3 according to the present embodiment further includes, in addition to the light-emitting unit section 11 and the light-receiving unit section 12, a case 40, a light-shielding wall 41, and a sealing layer 42. Note that in FIG. 3 and FIG. 4, illustrations of the driving circuit 13 and the output circuit 14 are omitted.

Hereinafter, a configuration of the detecting device 3 will be described using an XYZ coordinate system. The X-axis corresponds to an axis along a long side (one side) of the case 40 having a rectangular outer shape. The Y-axis is orthogonal to the X-axis and corresponds to an axis along the short side (the other side) of the case 40. The Z-axis is orthogonal to each of the X-axis and the Y-axis and corresponds to an axis along the normal line of the detection surface 16 that comes into contact with the measurement site M.

As illustrated in FIG. 3 and FIG. 4, the case 40 is a member that houses each constituent (the light-emitting unit section 11 and the light-receiving unit section 12) constituting the detecting device 3. The case 40 has a box shape including a rectangular flat plate-shaped bottom surface portion 40a and a rectangular frame-shaped side plate portion 40b protruding from the periphery of the bottom surface portion 40a to the +Z side. The case 40 is formed of aluminum, for example. An inner circumferential surface 40b1 of the side plate portion 40b is colored in black and thus has light-shielding properties. As a result, reflection on the inner circumferential surface 40b1 of the side plate portion 40b is suppressed.

Note that the material and manufacturing method of the case 40 may be selected as desired. For example, the case 40 can be formed by injection molding of a resin material. Furthermore, a configuration in which the case 40 is formed integrally with the housing section 1 is also suitable.

The light-emitting unit section 11 and the light-receiving unit section 12 are installed on the bottom surface portion 40a of the case 40 in a state of being mounted on a wiring substrate (not illustrated). The light-shielding wall 41 is disposed between the light-emitting unit section 11 and the light-receiving unit section 12 in the direction along the X-axis. The light-shielding wall 41 is a flat plate-shaped member protruding from the bottom surface portion 40a to the +Z side and extending in the Y-axis direction. The light-shielding wall 41 divides the housing space inside the case 40 into two in the X-axis direction. That is, the light-shielding wall 41 is a member that separates the space housing the light-emitting unit section 11 and the light-receiving unit section 12 in the direction along the X-axis. The light-shielding wall 41 is a member having light-shielding properties for shielding light so as to prevent light emitted from the light-emitting unit section 11 from being directly incident on the light-receiving section 12. Since it is a flat plate-shaped member, the light-shielding wall 41 of the present embodiment does not upsize the device configuration in the direction along the X-axis.

In the present embodiment, the light-shielding wall 41 is provided between the light-emitting unit section 11 including a first light-emitting section 50 and a second light-emitting section 60 and the light-receiving unit section 12 in the direction along the X-axis. It can also be said that the light-shielding wall 41 is a member that blocks a portion of green light LG, red light LR, and near-infrared light LI.

The sealing layer 42 is an optically transparent resin material filled into a gap between the light-emitting unit section 11 and the light-receiving unit section 12 housed within the case 40 and the side plate portion 40b. The sealing layer 42 seals (molds) the light-emitting unit section 11 and the light-receiving unit section 12 within the case 40. The surface of the sealing layer 42 functions as the detection surface 16.

Note that instead of a configuration in which the sealing layer 42 is used to seal, a configuration may be employed in which the upper surface of the side plate portion 40b of the case 40 is covered by a transmissive substrate. In this case, the upper surface of the transmissive substrate functions as the detection surface 16.

The light-emitting unit section 11 includes the first light-emitting section 50, the second light-emitting section 60, and a third light-emitting section 70. The first light-emitting section 50, the second light-emitting section 60, and the third light-emitting section 70 are light sources that each emit light of a different wavelength to the measurement site M.

The first light-emitting section 50 emits green light (first light) LG having a green wavelength band of 520 nm to 550 nm toward the measurement site M. The green light LG of the present embodiment is, for example, light having a peak wavelength of 520 nm.

The second light-emitting section 60 emits red light (second light) LR having a red wavelength band of 600 nm to 800 nm toward the measurement site M, for example. The red light LR of the present embodiment is, for example, light having a peak wavelength of 660 nm.

The third light-emitting section 70 emits near-infrared light (third light) LI having a near-infrared wavelength band of 800 nm to 1300 nm toward the measurement site M, for example. The near-infrared light LI of the present embodiment is, for example, light having a peak wavelength of 905 nm.

As the light-emitting elements constituting the first light-emitting section 50, the second light-emitting section 60, and the third light-emitting section 70, a bare chip-type or a shell-type light-emitting diode (LED) is suitably utilized, for example. Note that the wavelength of light emitted by each light-emitting section is not limited to the above-described numerical range. Hereinafter, when the first light-emitting section 50, the second light-emitting section 60, and the third light-emitting section 70 are not particularly distinguished, they are collectively referred to as the light-emitting sections 50, 60, and 70.

Each of the light-emitting sections 50, 60, and 70 is installed in the case 40 so that the light-emitting surface thereof is parallel to the XY plane. That is, each of the light-emitting sections 50, 60, and 70 emits light toward the +Z side.

Each of the light-emitting sections 50, 60, and 70 emits light by the driving current supplied from the driving circuit 13 illustrated in FIG. 2. In the case of the present embodiment, the driving circuit 13 causes each of the light-emitting sections 50, 60, and 70 to emit light independently in time sequence. Hereinafter, an aspect in which each of the light-emitting sections 50, 60, and 70 independently emits light in time sequence is referred to by saying that the light-emitting sections 50, 60, and 70 periodically emits light in time division.

Light emitted from each of the light-emitting sections 50, 60, and 70 is incident on the measurement site M. After being propagated through repeated reflections and scatterings inside the measurement site M, the light is emitted to the housing section 1 side to reach the light-receiving unit section 12. That is, the detecting device 3 according to the present embodiment is a reflection-type optical sensor in which the light-emitting unit section 11 and the light-receiving unit section 12 are positioned on one side of the measurement site M.

As illustrated in FIG. 3, the light-emitting sections 50, 60, and 70 are disposed side by side and spaced apart from each other in the direction along the Y-axis (first direction). Specifically, the second light-emitting section 60 is disposed on the +Y side of the first light-emitting section 50, while the third light-emitting section 70 is disposed on the −Y side of the first light-emitting section 50. That is, the first light-emitting section 50 is disposed between the second light-emitting section 60 and the third light-emitting section 70 in the direction along the Y-axis. Furthermore, it can also be said that the first light-emitting section 50 is positioned between the second light-emitting section 60 and the third light-emitting section 70.

Traditionally, detecting devices capable of acquiring both the pulse peak interval (PPI) and oxygen saturation (SpO2) as biological information of a test subject are known. Furthermore, there is a demand for further downsizing of measuring devices that include such a detecting device. In view of such background, the present inventors conducted diligent research on small detecting devices capable of acquiring both the pulse peak interval and oxygen saturation.

First, the present inventors focused on the fact that the transmittance of skin varies by the wavelength band of light.

Figure 5:
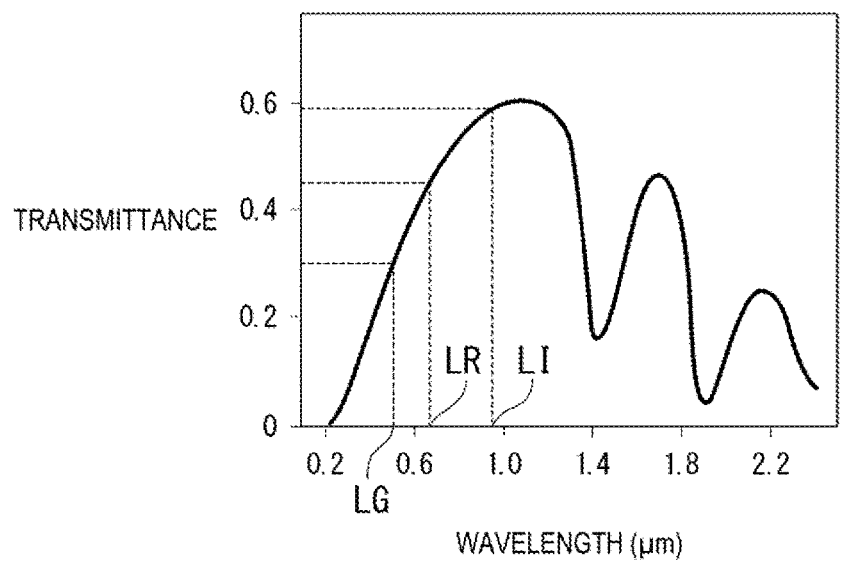
FIG. 5 is a graph showing a transmission spectrum of a skin.

FIG. 5 is a graph showing a transmission spectrum of a skin. In FIG. 5, the horizontal axis indicates the wavelength of light, while the vertical axis indicates the transmittance (unit: %). FIG. 5 shows the transmission spectrum when the skin thickness is 0.43 mm as an example.

As illustrated in FIG. 5, the transmittance of the wavelength band of the green light LG (e.g., 520 nm) when incident on the skin is approximately 30%; the transmittance of the wavelength band of the red light LR (e.g., 660 nm) when incident on the skin is approximately 50% to 60%; and the transmittance of the wavelength band of the near-infrared light LI (e.g., 905 nm) when incident on the skin is approximately 60%.

The graph shown in FIG. 5 shows that the distance that light can propagate in a living body differs per wavelength of light. That is, according to the graph of FIG. 5, it can be seen that the green light LG can only propagate a short distance in the living body compared to the red light LR or the near-infrared light LI. In other words, it can also be said that the red light LR and the near-infrared light LI can propagate farther in the living body than the green light LG. Note that in FIG. 5, an example is given in which the skin thickness is 0.43 mm. However, even when the skin thickness is different, the red light LR and the near-infrared light LI can similarly propagate farther in the living body than the green light LG.

As shown in the graph of FIG. 5, the present inventors discovered that the green light LG is easily attenuated as it passes through the living body compared to the red light LR and the near-infrared light LI.

Furthermore, the present inventors simulated the state of incidence on the light-receiving section of the green light LG that passed through the living body. In this simulation, a traditionally-used regular-sized light-receiving section was used. As a reference, the results of the simulation are shown in the bottom row of FIG. 3.

As illustrated in FIG. 3, a light incident region 7 in which the green light LG was incident in a concentrated manner was formed on a light-receiving surface 9a on the first light-emitting section 50 side (the left side of the bottom row of FIG. 3) of a regular-sized light-receiving section 9. However, it was confirmed that almost no green light LG was incident on the light-receiving surface 9a on the side away from the first light-emitting section 50 (the right side of the bottom row of FIG. 3). This is because the green light LG is sufficiently attenuated in the living body before it is incident on the light-receiving surface 9a away from the first light-emitting section 50.

The present inventors discovered that, in the vicinity of the light-emitting section, at a light incident region in which the green light LG transmitted through the living body is concentrated, disposing a light-receiving section for green light having a size corresponding to the light incident region can make the device configuration small.

Furthermore, the present inventors focused on the fact that the noise component contained in red light and near-infrared light that propagate in the living body and that are incident on a light-receiving section changes in accordance with the distance from a light-emitting section to the light-receiving section. In the following description, red light is used as an example. However, the same applies to near-infrared light.

Figure 6:
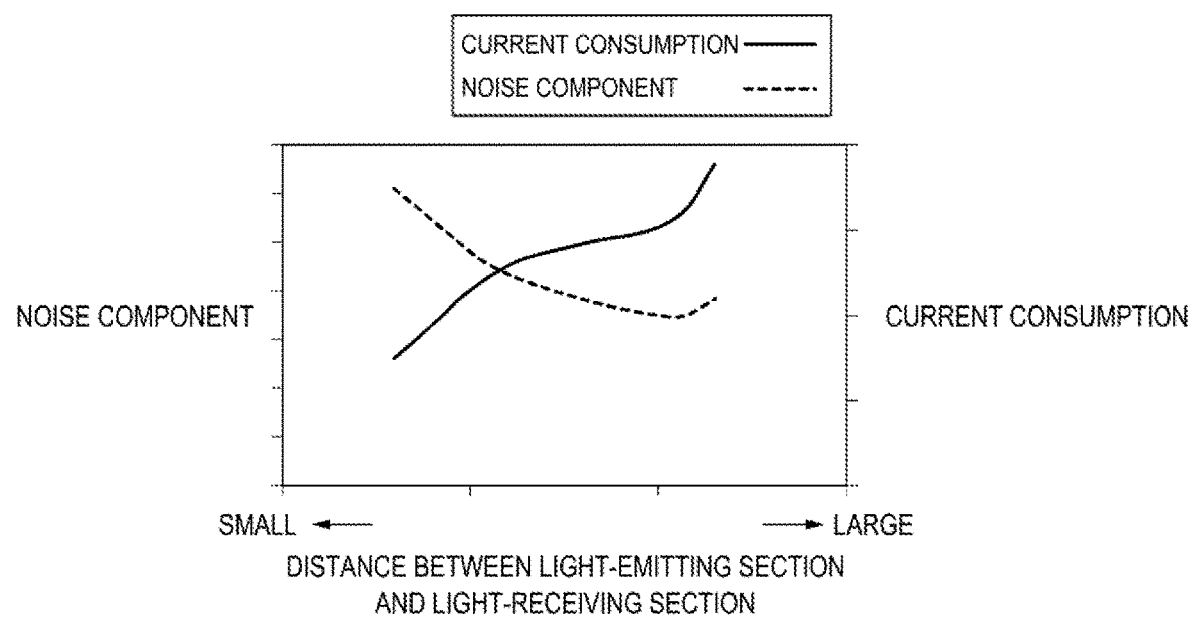
FIG. 6 is a graph illustrating a relationship between a red light-emitting section and a light-receiving section.

FIG. 6 is a graph illustrating a relationship among the distance from a red light-emitting section that emits red light to a light-receiving section, the noise component of red light, and the current consumption of the red light-emitting section. In FIG. 6, the horizontal axis indicates the distance from the red light-emitting section to the light-receiving section; the vertical axis on the left side indicates the noise component of the red light LR; and the vertical axis on the right side indicates the current consumption of the light-emitting section.

As illustrated in FIG. 6, the closer the distance between the light-receiving section and the light-emitting section is, the more the noise component of the red light LR received at the light-receiving section increases. In other words, the farther away the light-receiving section is disposed from the light-emitting section, the more the noise component of the red light LR decreases, which improves the detection accuracy for the red light LR. This is because on a light-receiving section disposed close to the light-emitting section, a red light component that is reflected at the surface layer portion of the living body and thus does not pass through the blood is incident. Such red light LR that does not pass through the blood is a noise component in identifying blood oxygen concentration at the light-receiving section.

Accordingly, disposing the light-receiving section away from the red light-emitting section can reduce the noise component contained in the red light LR and improve the detection accuracy for the red light LR. On the other hand, when the light-receiving section is disposed away from the red light-emitting section, the distance to be propagated in the living body increases. Therefore, the input current to the red light-emitting section needs to be increased to increase the luminance of the red light. In this case, since current consumption of the red light-emitting section increases, the distance between the red light-emitting section and the light-receiving section may be determined taking into account the balance between the noise component and current consumption.

Note that, for the near-infrared light LI as well, similar to the red light LR, disposing the near-infrared light-emitting section that emits the near-infrared light LI and the light-receiving section away from each other can improve the detection accuracy for the near-infrared light LI. Furthermore, the distance between the near-infrared light-emitting section and the light-receiving section may be determined taking into account the balance between the noise component and the current consumption.

The present inventors discovered that disposing a light-receiving section that receives the red light LR or the near-infrared light LI away from the light-emitting section improves the detection accuracy for the red light LR or the near-infrared light LI.

Based on the above-described discoveries, the present inventors completed the detecting device 3 and the measuring device 100 according to the present embodiment. Hereinafter, a configuration of the detecting device 3 and the measuring device 100 according to the present embodiment will be specifically described.

The light-receiving unit section 12 receives light caused by the light emission of the light-emitting unit section 11 and coming from the measurement site M. The light-receiving unit section 12 of the present embodiment includes a first light-receiving section 51 and a second light-receiving section 61. The light-receiving section 51 and the light-receiving section 61 generate a detection signal in accordance with the intensity of received light. Hereinafter, when the light-receiving section 51 and the light-receiving section 61 are not particularly distinguished, they are collectively referred to as the "light-receiving sections 51 and 61".

The light-receiving unit section 12 is installed in the case 40 so that the light-receiving surface of each of the light-receiving sections 51 and 61 is parallel to the XY plane. That is, each of the light-receiving sections 51 and 61 is configured to receive light incident from the Z direction.

As illustrated in FIG. 3, the light-receiving sections 51 and 61 are disposed side by side and spaced apart from each other in the direction along the X-axis (second direction) that intersects (is orthogonal to) the Y-axis. Specifically, the first light-receiving section 51 is positioned on the +X side of the light-emitting unit section 11, while the second light-receiving section 61 is positioned on the +X side of the first light-receiving section 51. The second light-receiving section 61 is disposed on a side opposite to the light-emitting unit section 11 with the first light-receiving section 51 interposed therebetween. In the case of the present embodiment, the second light-receiving section 61 is provided at a position farther away from the first light-emitting section 50 than the first light-receiving section 51. Specifically, the first light-receiving section 51 is positioned more on the first light-emitting section 50 side than the second light-receiving section 61 in the direction along the X-axis.

Here, the distance from the first light-emitting section 50 to the first light-receiving section 51 is D1; the distance from the second light-emitting section 60 to the second light-receiving section 61 is D2; and the distance from the third light-emitting section 70 to the second light-receiving section 61 is D3. The distance D1 corresponds to the distance between the center portions of the first light-emitting section 50 and the first light-receiving section 51 when viewed in plan view from the Z-axis direction. Furthermore, the distance D2 corresponds to the distance between the center portions of the second light-emitting section 60 and the second light-receiving section 61 when viewed in plan view from the Z-axis direction. Furthermore, the distance D3 corresponds to the distance between the center portions of the third light-emitting section 70 and the second light-receiving section 61 when viewed in plan view from the Z-axis direction.

In the detecting device 3 according to the present embodiment, the distance D1 from the first light-emitting section 50 to the first light-receiving section 51 is shorter than the distance D2 from the second light-emitting section 60 to the second light-receiving section 61. Furthermore, the distance D1 from the first light-emitting section 50 to the first light-receiving section 51 is shorter than the distance D3 from the third light-emitting section 70 to the second light-receiving section 61. Note that the distance D2 and the distance D3 are equal.

In this way, for the detecting device 3 according to the present embodiment, a configuration is employed in which the first light-receiving section 51 for receiving the green light LG is disposed at the position closest to the first light-emitting section 50 that emits the green light LG. As a result, the first light-receiving section 51 is capable of receiving the green light LG transmitted through the living body without being attenuated and emitted therefrom.

In the detecting device 3 according to the present embodiment, when receiving the green light LG emitted from the first light-emitting section 50 and propagated inside the measurement site M, the first light-receiving section 51 generates a detection signal in accordance with the received light intensity. The second light-receiving section 61 receives the red light LR emitted from the second light-emitting section 60 and propagated inside the measurement site M or the near-infrared light LI emitted from the third light-emitting section 70 and propagated inside the measurement site M, and generates a detection signal in accordance with the received light intensity.

In the case of the present embodiment, the light-receiving unit section 12 receives each light in synchronization with the light emission timing of the light-emitting sections 50, 60, and 70 that are driven in time division, and generates a detection signal in accordance with each light.

The light-receiving unit section 12 sends the detection signal generated at each of the light-receiving sections 51 and 61 to the output circuit 14. The output circuit 14 includes, for example, an A/D converter that converts the detection signal generated by each of the light-receiving sections 51 and 61 from analog to digital, and an amplification circuit that amplifies the converted detection signal (both not illustrated). The output circuit 14 generates a plurality of detection signals S (S1, S2, and S3) corresponding to different wavelengths.

Here, the detection signal S1 is a signal that represents the received light intensity of the first light-receiving section 51 when the green light LG emitted from the first light-emitting section 50 is received. The detection signal S2 is a signal that represents the received light intensity of the second light-receiving section 61 when the red light LR emitted from the second light-emitting section 60 is received. The detection signal S3 is a signal that represents the received light intensity of the second light-receiving section 61 when the near-infrared light LI emitted from the third light-emitting section 70 is received.

In general, since the absorbance of blood varies between the diastolic phase and the systolic phase of the blood vessel, each of the detection signals S is a pulse wave signal that includes a periodic fluctuation component corresponding to the pulsating component (plethysmogram) of an artery inside the measurement site M.

Note that the driving circuit 13 and the output circuit 14 are mounted on the wiring substrate together with the light-emitting unit section 11 and the light-receiving unit section 12 in the form of an integrated circuit (IC) chip. Note that, as described above, the driving circuit 13 and the output circuit 14 may be installed outside of the detecting device 3.

The control device 5 is an arithmetic processing device such as a central processing unit (CPU) and a field-programmable gate array (FPGA). The control device 5 controls the entire measuring device 100. The storage device 6 is constituted, for example, by a non-volatile semiconductor memory. The storage device 6 stores a program executed by the control device 5 and various data used by the control device 5. Note that a configuration in which the functions of the control device 5 are distributed among a plurality of integrated circuits or a configuration in which some or all of the functions of the control device 5 are realized by a dedicated electronic circuit can also be employed. Note that in FIG. 2, the control device 5 and the storage device 6 are illustrated as separate constituents. However, it is also possible to realize the control device 5 including the storage device 6 by, for example, an application-specific integrated circuit (ASIC) and the like.

The control device 5 of the present embodiment executes a program stored in the storage device 6, and thereby identifies biological information of the test subject from the plurality of detection signals S (S1, S2, and S3) generated by the detecting device 3.

Specifically, the control device (information analysis section) 5 identifies a pulse wave of the test subject from the detection signal S1 that represents the received light intensity of the green light LG received by the first light-receiving section 51. The controller 5 can identify a pulse peak interval (PPI) of the test subject based on, for example, the detection signal S1. Furthermore, the control device 5 can analyze the detection signal S2 that represents the received light intensity of the red light LR received by the second light-receiving section 61, and the detection signal S3 that represents the received light intensity of the near-infrared light LI received by the second light-receiving section 61, and thereby identify oxygen saturation (SpO2) of the test subject.

As described above, in the measuring device 100, the control device 5 functions as an information analysis section that identifies biological information from detection signals S indicating detection results by the detecting device 3. The control device 5 causes the display device 4 to display biological information identified from detection signals S. Note that it is also possible to notify a user of a measurement result by sound output. A configuration in which a user is notified of a warning (possibility of impairment in a bodily function) when the pulse rate or oxygen saturation fluctuates to a numerical value outside a predetermined range is also suitable.

As illustrated in FIG. 6, the width of the first light-receiving section 51 in the direction along the X-axis is smaller than the width of the second light-receiving section 61 in the direction along the X-axis. In the case of the detecting device 3 according to the present embodiment, the area of the first light-receiving section 51 is smaller than the area of the second light-receiving section 61. Here, the areas of the first light-receiving section 51 and the second light-receiving section 61 mean plane areas when viewed in plan view from the +Z side. In the case of the present embodiment, the area of the first light-receiving section 51 is set to a size corresponding to a light incident region 7 in which the green light transmitted through the living body is concentrated as illustrated in the simulation result in FIG. 3. For the detecting device 3 according to the present embodiment, a configuration is employed in which the size of the first light-receiving section 51 that receives the green light LG is smaller than the size of traditional, commonly used light-receiving sections. In the case of the present embodiment, the size of the first light-receiving section 51 is approximately half the size of traditional, commonly used light-receiving sections. Note that the unit price of a light-receiving section depends on the area. Therefore, in the present embodiment, downsizing the first light-receiving section 51 can reduce cost.

According to the light-receiving unit section 12 of the present embodiment, even when the first light-receiving section 51 is downsized, the green light LG that passed through the living body can be received at a sufficient amount of light. Thus, in the detecting device 3 according to the present embodiment, since there is no need to increase current consumption of the first light-emitting section 50 in order to increase the light emission amount of the green light LG, power consumption of the light-emitting unit section 11 can be reduced.

Furthermore, in the detecting device 3 according to the present embodiment, a portion of the second light-receiving section 61 that receives the red light LR or the near-infrared light LI is provided so as to overlap a portion of the space made by downsizing the first light-receiving section 51 that receives the green light LG. In other words, for the detecting device 3 according to the present embodiment, a configuration is employed in which the second light-receiving section 61 is disposed in a space made by downsizing of the first light-receiving section 51, whereby the second light-receiving section 61 is disposed closer to the light-emitting unit section 11 side. Thus, in the detecting device 3 according to the present embodiment, since the light-receiving unit section 12 including the first light-receiving section 51 and the second light-receiving section 61 decreases in size, the device configuration can be downsized.

Furthermore, for the detecting device 3 according to the present embodiment, a configuration is employed in which the second light-receiving section 61 that receives the red light LR or the near-infrared light LI is disposed at a position away from the second light-emitting section 60 or the third light-emitting section 70. In the detecting device 3 according to the present embodiment, the distance between the second light-emitting section 60 or the third light-emitting section 70 and the second light-receiving section 61 (distance D2 or distance D3) is greater than the distance D1 between the first light-emitting section 50 and the first light-receiving section 51.

In other words, the distance that the red light LR and the near-infrared light LI propagate in the living body before being incident on the second light-receiving section 61 is greater than the distance that the green light LG propagates in the living body before being incident on the first light-receiving section 51.

As shown in FIG. 5, with the red light LR or the near-infrared light LI, the longer the propagation distance in the living body is, the more the component that is reflected at the surface layer portion of the living body and thus does not pass through the blood, that is, a noise component in identifying blood oxygen concentration decreases. With the noise component suppressed from being incident, the second light-receiving section 61 of the present embodiment can obtain a high signal/noise (S/N) ratio. Thus, in the detecting device 3 according to the present embodiment, the red light LR or the near-infrared light LI can be received with high accuracy at the second light-receiving section 61.

On the other hand, when the propagation distance in the living body of the red light LR or the near-infrared light LI is too long, it becomes necessary to increase the light emission amount of the second light-emitting section 60 or the third light-emitting section 70. In the case of the present embodiment, the second light-receiving section 61 is installed in the space made by downsizing of the first light-receiving section 51, and the second light-receiving section 61 is brought to the light-emitting unit section 11 side; whereby the second light-receiving section 61, the second light-emitting section 60, and the third light-emitting section 70 are each disposed in a suitable position. As a result, power consumption of the second light-emitting section 60 or the third light-emitting section 70 can be restrained and power consumption of the light-emitting unit section 11 can be suppressed while maintaining the light receiving accuracy for the red light LR and the near-infrared light LI.

As illustrated in FIG. 4, the first light-receiving section 51 includes a light-receiving element (first sensor section) 120, an angle-limiting filter (first angle-limiting filter) 121, and a band-pass filter 122. The first light-receiving section 51 of the present embodiment includes a single light-receiving element 120.

The light-receiving element 120 is constituted by, for example, a photodiode (PD). The angle-limiting filter 121 is provided so as to cover the entire light-receiving surface 120a of the light-receiving element 120. The angle-limiting filter 121 is formed, for example, by embedding a plug 1212 formed of a material having light-shielding properties such as tungsten in a silicon oxide layer 1211 having optical transparency.

The silicon oxide layer 1211 forms an optical path that guides light to the light-receiving surface 120a of the light-receiving element 120. The plug 1212 embedded in the silicon oxide layer 1211 limits the incident angle of light passing through the optical path (the silicon oxide layer 1211). That is, when the light incident into the silicon oxide layer 1211 is tilted relative to the optical path by a predetermined angle or more, the incident light impinges on the plug 1212, causing a portion of that light to be absorbed by the plug 1212 and the remainder to be reflected. Further, since the intensity of the reflected light grows weak through repeated reflections before passing through the optical path, light that can ultimately pass through the angle-limiting filter 121 is substantially limited to light that is tilted relative to the light path by a predetermined limit angle or less.

The angle-limiting filter 121 has a characteristic of transmitting light incident at an angle smaller than a predetermined incident angle, and cutting, rather than transmitting, light incident at an angle greater than a predetermined incident angle. As a result, the angle-limiting filter 121 is capable of limiting the incident angle of light incident on the light-receiving element 120. Specifically, the angle-limiting filter 121 transmits light that propagates in the living body and thus is incident at a predetermined incident angle (hereinafter referred to as the permissible incident angle), and cuts light that is incident at an angle greater than the permissible incident angle, including outside light such as sunlight and light that was not incident on the living body.

The band-pass filter 122 has a characteristic of selectively transmitting a wavelength band of the green light LG, and absorbing and thereby cutting the red light LR and the near-infrared light LI, which fall under light in the other wavelength bands. The band-pass filter 122 is formed, for example, by alternately stacking a plurality of low refractive index layers such as silicon oxide and a plurality of high refractive index layers such as titanium oxide on the angle-limiting filter 121.

Furthermore, the second light-receiving section 61 includes a light-receiving element (second sensor section) 220 that receives the red light LR or the near-infrared light LI, and an angle-limiting filter (second angle-limiting filter) 221 that limits the incident angle of the red light LR or the near-infrared light LI reaching the light-receiving element 220. That is, in the detecting device 3 according to the present embodiment, the second light-receiving section 61 has a configuration different from that of the first light-receiving section 51 in that the second light-receiving section 61 include no band-pass filter that selectively transmits the red light LR or the near-infrared light LI.

The light-receiving element 220 is constituted, for example, by a photodiode. The angle-limiting filter 221 is provided on the light-receiving surface 220a of the light-receiving element 220. The angle-limiting filter 221 has a configuration similar to that of the angle-limiting filter 121. The angle-limiting filter 221 is capable of limiting the incident angle of the red light LR or the near-infrared light LI reaching the light-receiving element 220. For example, the angle-limiting filter 221 transmits the red light LR or the near-infrared light LI that propagates in the living body and is incident at a permissible incident angle, and cuts light that is incident at an angle greater than the permissible incident angle, including outside light such as sunlight and the red light LR or the near-infrared light LI that did not pass through the living body.

Here, a portion of the red light LR and the near-infrared light LI emitted from the second light-emitting section 60 sometimes passes through the living body and is incident on the light-receiving section 51. In the case of the present embodiment, the first light-receiving section 51 includes a band-pass filter 122 that selectively transmits the green light LG. For this reason, the first light-receiving section 51 can cut the red light LR and the near-infrared light LI, each of which have a wavelength band different from that of the green light LG. Thus, the first light-receiving section 51 can efficiently receive the green light LG emitted from the light-emitting section 50.

Figure 7:
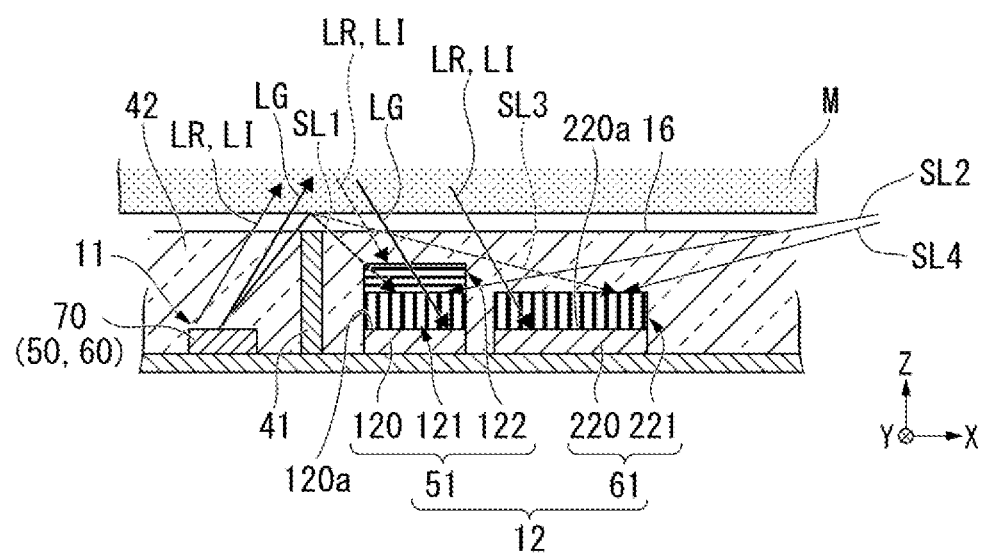
FIG. 7 is a view for explaining an operation of a detecting device.

FIG. 7 is a view for explaining an operation of the detecting device 3.

As illustrated in FIG. 7, in the detecting device 3 according to the present embodiment, a portion of the green light LG emitted from the first light-emitting section 50 is reflected by the surface of the living body (measurement site M) and thus is sometimes directly incident on the first light-receiving section 51 without passing through the living body. Furthermore, outside light such as sunlight is sometimes directly incident on the first light-receiving section 51 by passing through the gap between the living body and the detection surface 16. Hereinafter, the green light LG heading to the first light-receiving section 51 without passing through the living body is referred to as the "first stray light component SL1". Outside light directly heading to the first light-receiving section 51 is referred to as the "second stray light component SL2".

Since it has a green wavelength band, the first stray light component SL1 passes through the band-pass filter 122 and is incident on the angle-limiting filter 121 provided at a lower layer of the band-pass filter 122. As described above, the angle-limiting filter 121 has a characteristic of transmitting light incident at an angle smaller than the permissible incident angle, and cutting light incident at an angle greater than the permissible incident angle.

Since the first stray light component SL1 is incident on the first light-receiving section 51 without passing through the living body, the incident angle of the green light LG relative to the first light-receiving section 51 is greater than the permissible incident angle of the angle-limiting filter 121. In other words, the first stray light component SL1 is cut by the angle-limiting filter 121. As a result, the first light-receiving section 51 can suppress the first stray light component SL1 from being incident on the light-receiving surface 120a of the light-receiving element 120 by the angle-limiting filter 121.

The second stray light component SL2 is generally cut by the band-pass filter 122. However, the component having a green wavelength band contained in the second stray light component SL2 is transmitted through the band-pass filter 122. Here, as described above, since the second stray light component SL2 is incident by passing through the gap between the living body and the detection surface 16, the incident angle of the second stray light component SL2 relative to the first light-receiving section 51 is greater than the permissible incident angle of the angle-limiting filter 121. Therefore, a portion of the second stray light component SL2 transmitted through the band-pass filter 122 (the component having a green wavelength band) is cut by the angle-limiting filter 121. As a result, the first light-receiving section 51 can suppress the second stray light component SL2 from being incident on the light-receiving surface 120a of the light-receiving element 120 by the angle-limiting filter 121.

In this way, in the detecting device 3 according to the present embodiment, it is possible to cause the green light LG emitted from the light-emitting unit section 11 and passed through the living body to be efficiently incident on the light-receiving surface 120a of the light-receiving element 120. Furthermore, in the detecting device 3 according to the present embodiment, it can be made difficult for the first stray light component SL1 and the second stray light component SL2 to be incident on the light-receiving surface 120a of the light-receiving element 120.

Thus, with the first stray light component SL1 and the second stray light component SL2 that represent noise components suppressed from being incident, the first light-receiving section 51 can obtain a high S/N ratio. Therefore, in the detecting device 3 according to the present embodiment, since the green light LG can be received with high accuracy at the first light-receiving section 51, the light emission amount of the green light LG at the first light-emitting section 50 can be restrained to suppress power consumption of the light-emitting unit section 11.

Furthermore, a portion of the red light LR emitted from the second light-emitting section 60 or a portion of the near-infrared light LI emitted from the third light-emitting section 70 is sometimes directly incident on the second light-receiving section 61 without passing through the living body.

Furthermore, outside light such as sunlight is sometimes directly incident on the second light-receiving section 61 by passing through the gap between the living body and the detection surface 16. Hereinafter, the red light LR or the near-infrared light LI heading directly to the second light-receiving section 61 without passing through the living body is collectively referred to as the "third stray light component SL3". Outside light heading directly to the second light-receiving section 61 is referred to as the "fourth stray light component SL4".

Since the third stray light component SL3 is incident on the angle-limiting filter 221 without passing through the living body, the incident angle of the third stray light component SL3 relative to the second light-receiving section 61 is greater than the permissible incident angle of the angle-limiting filter 221. Furthermore, since the fourth stray light component SL4 is incident by passing through the gap between the living body and the detection surface 16, the incident angle of the fourth stray light component SL4 relative to the second light-receiving section 61 is greater than the permissible incident angle of the angle-limiting filter 221.

Therefore, the third stray light component SL3 and the fourth stray light component SL4 are successfully cut by the angle-limiting filter 221. As a result, the second light-receiving section 61 can suppress the third stray light component SL3 and the fourth stray light component SL4 from being incident on the light-receiving surface 220a of the light-receiving element 120 by the angle-limiting filter 221.

In this way, in the detecting device 3 according to the present embodiment, it is possible to cause the red light LR or the near-infrared light LI emitted from the light-emitting unit section 11 and passed through the living body to be efficiently incident on the light-receiving surface 220a of the light-receiving element 220. Furthermore, in the detecting device 3 according to the present embodiment, it can be made difficult for the third stray light component SL3 and the fourth stray light component SL4 to be incident on the light-receiving surface 220a of the light-receiving element 220.

Thus, with the third stray light component SL3 and the fourth stray light component SL4 that represent noise components suppressed from being incident, the second light-receiving section 61 can obtain a high S/N ratio. According to the detecting device 3 according to the present embodiment, since the red light LR and the near-infrared light LI are efficiently received at the second light-receiving section 61, the light emission amount of each of the second light-emitting section 60 and the third light-emitting section 70 can be restrained to suppress power consumption of the light-emitting unit section 11.

Furthermore, in the case of the present embodiment, only the red light LR and the near-infrared light LI are incident on the second light-receiving section 61. Therefore, no band-pass filter that selectively transmits the red light LR and the near-infrared light LI and cuts the green light LG is provided at the second light-receiving section 61. That is, for the detecting device 3 according to the present embodiment, a configuration may be employed in which only the first light-receiving section 51 includes the band-pass filter 122 and the second light-receiving section 61 includes no band-pass filter. Thus, in the detecting device 3 according to the present embodiment, the band-pass filter for the second light-receiving section 61 can be omitted to reduce cost.

According to the detecting device 3 according to the present embodiment, even when the light emission amount of each of the light-emitting sections 50, 60, and 70 is restrained to reduce power consumption, light passed through the living body can be received with high accuracy at the light-receiving unit section 12. Furthermore, in the detecting device 3 according to the present embodiment, the band-pass filter in the second light-receiving section 61 can be omitted to reduce cost.

As described above, the detecting device 3 according to the present embodiment includes: the first light-emitting section 50 configured to emit the green light LG; the second light-emitting section 60 configured to emit the red light LR having a wavelength band higher than that of the green light LG; the third light-emitting section 70 configured to emit the near-infrared light LI having a wavelength band higher than that of the green light LG; the first light-receiving section 51 configured to receive the green light LG emitted from the first light-emitting section 50 and emitted from the measurement site M; and the second light-receiving section 61 configured to receive the red light LR or the near-infrared light LI emitted from the second light-emitting section 60 or the third light-emitting section 70 and emitted from the measurement site M. In the direction along the X-axis, the first light-receiving section 51 is disposed closer to the first light-emitting section 50 than the second light-receiving section 61. The area of the first light-receiving section 51 is smaller than the area of the second light-receiving section 61. The first light-receiving section 51 includes a single light-receiving element 120. The width of the first light-receiving section 51 in the direction along the X-axis is smaller than the width of the second light-receiving section 61 in the direction along the X-axis.

The detecting device 3 according to the present embodiment includes the first light-receiving section 51 having a size corresponding to the light incident region 7 on which the green light LG transmitted through the living body is incident in a concentrated manner. The size of the first light-receiving section 51 is smaller than the size of traditional, commonly used light-receiving sections. The second light-receiving section 61 is disposed so that a portion thereof overlaps a portion of the space made by downsizing the first light-receiving section 51. Therefore, the second light-receiving section 61 and the light-emitting unit section 11 are disposed closer to each other. Thus, according to the detecting device 3 according to the present embodiment, since the light-receiving unit section 12 including the first light-receiving section 51 and the second light-receiving section 61 can be decreased in size, the device configuration can be downsized. Thus, a small detecting device 3 capable of acquiring both the pulse peak interval and oxygen saturation is provided. Furthermore, downsizing the first light-receiving section 51 can reduce cost.

The detecting device 3 according to the present embodiment further includes the flat plate-shaped light-shielding wall 41 provided between the first light-emitting section 50 and the first light-receiving section 51 and configured to block at least a portion of the green light LG.

According to the detecting device 3 according to the present embodiment, since the flat plate-shaped light-shielding wall 41 is included, the device configuration can be downsized in the width direction of the light-shielding wall 41, that is, in the direction along the X-axis.

Second Embodiment

Next, a second embodiment will be described. For the first embodiment, an example is given of a case in which the first light-receiving section 51 is constituted by a single light-receiving element. However, a detecting device according to the present embodiment differs from that of the first embodiment in that the first light-receiving section is constituted by two light-receiving elements.

Figure 8:
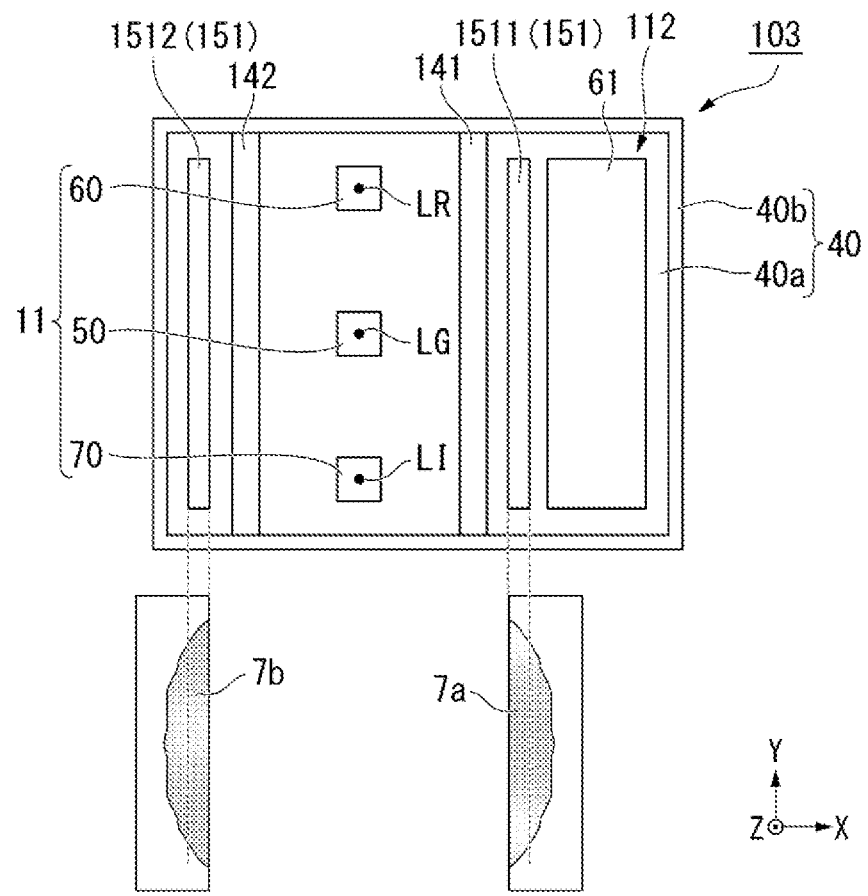
FIG. 8 is a cross-sectional view of a detecting device according to a second embodiment.

FIG. 8 is a cross-sectional view of a detecting device according to the present embodiment. FIG. 8 is a view illustrating a configuration corresponding to FIG. 3 in the first embodiment. Note that configurations and members common to the first embodiment will be given an identical reference numeral and detailed description thereof will be omitted. Note that in FIG. 8, for convenience of explanation, light incident regions 7a and 7b in which the green light LG transmitted through the living body is concentrated are illustrated on the −Z side of a detecting device 103.

As illustrated in FIG. 8, a light-receiving unit 112 in the detecting device 103 according to the present embodiment includes a first light-receiving section 151 and the second light-receiving section 61. The first light-receiving section 151 of the present embodiment includes a first light-receiving portion 1511 and a second light-receiving portion 1512. The first light-receiving portion 1511 and the second light-receiving portion 1512 are disposed sandwiching the first light-emitting section 50 in the direction along the X-axis.

In the case of the present embodiment, the first light-receiving portion 1511 is provided on the +X side of the first light-emitting section 50, while the second light-receiving portion 1512 is provided on the −X side of the first light-emitting section 50. The first light-receiving portion 1511 and the second light-receiving portion 1512 each have a configuration similar to that of the first light-receiving section 51 of the first embodiment, and differ only in size. The first light-receiving portion 1511 and the second light-receiving portion 1512 have the same area. The first light-receiving portion 1511 and the second light-receiving portion 1512 each have an area obtained by dividing the first light-receiving section 51 of the first embodiment in half. Therefore, in the present embodiment, the total area of the first light-receiving portion 1511 and the second light-receiving portion 1512 is smaller than the area of the second light-receiving section 61.

Here, since the first light-receiving portion 1511 and the second light-receiving portion 1512 each have a half area of the first light-receiving section 51, the unit prices of the first light-receiving portion 1511 and the second light-receiving portion 1512 are lower than that of the first light-receiving section 51. Therefore, according to the present embodiment, the first light-receiving section 151 can be configured using the first light-receiving portion 1511 and the second light-receiving portion 1512 that have low unit prices to suppress the cost of the detecting device 103.

The detecting device 103 according to the present embodiment further includes a first light-shielding wall 141 and a second light-shielding wall 142.

The first light-shielding wall 141 is disposed between the light-emitting unit section 11 and the first light-receiving portion 1511 in the direction along the X-axis. The first light-shielding wall 141 is a flat plate-shaped member protruding from the bottom surface portion 40a to the +Z side and extending in the Y-axis direction. The first light-shielding wall 141 is a member having light-shielding properties for shielding light so as to prevent light emitted from the light-emitting unit section 11 from being directly incident on the first light-receiving portion 1511 or the second light-receiving section 61.

The second light-shielding wall 142 is disposed between the light-emitting unit section 11 and the second light-receiving portion 1512 in the direction along the X-axis. The second light-shielding wall 142 is a flat plate-shaped member protruding from the bottom surface portion 40a to the +Z side and extending in the Y-axis direction. The second light-shielding wall 142 is a member having light-shielding properties for shielding light so as to prevent light emitted from the light-emitting unit section 11 from being directly incident on the second light-receiving portion 1512.

The detecting device 103 according to the present embodiment includes the first light-shielding wall 141 and the second light-shielding wall 142, thereby dividing the housing space inside the case 40 into three in the X-axis direction.

The first light-receiving portion 1511 is provided at a position corresponding to the light incident region 7a formed on the +X side of the first light-emitting section 50 by the green light LG emitted from the first light-emitting section 50 and transmitted through the living body. The first light-receiving portion 1511 has a half area of the light-receiving section 51 of the first embodiment. In other words, the first light-receiving portion 1511 is capable of receiving substantially half of the amount of light incident on the light incident region 7a on the +X side of the first light-emitting section 50.

In the case of the present embodiment, the second light-receiving section 61 is moved to the −X side by as much as the first light-receiving portion 1511 is shrunk in width in the X direction, whereby increase in dimension in the X direction is restrained.

Here, the green light LG is emitted from the first light-emitting section 50 radially in various directions. Therefore, the green light LG transmitted through the living body is also concentrated on the −X side of the first light-emitting section 50 to form another light incident region 7b.

The second light-receiving portion 1512 is provided at a position corresponding to the light incident region 7b formed on the −X side of the first light-emitting section 50 by the green light LG emitted from the first light-emitting section 50 and transmitted through the living body. Similar to the first light-receiving portion 1511, the second light-receiving portion 1512 has a half area of the light-receiving section 51 of the first embodiment. In other words, the second light-receiving portion 1512 is capable of receiving substantially half of the amount of light incident on the light incident region 7b on the −X side of the first light-emitting section 50.

The total amount of light received at the first light-receiving portion 1511 and the second light-receiving portion 1512 is equal to the amount of light received at the light-receiving section 51 of the first embodiment. Therefore, according to the detecting device 103 according to the present embodiment, similar to the first embodiment, the green light LG can be efficiently received, and the device configuration can be downsized while cost is reduced.

Third Embodiment

Next, a third embodiment will be described. The detecting device according to the present embodiment differs from that of the other embodiments in that the first light-receiving section is constituted by four light-receiving elements.

Figure 9:
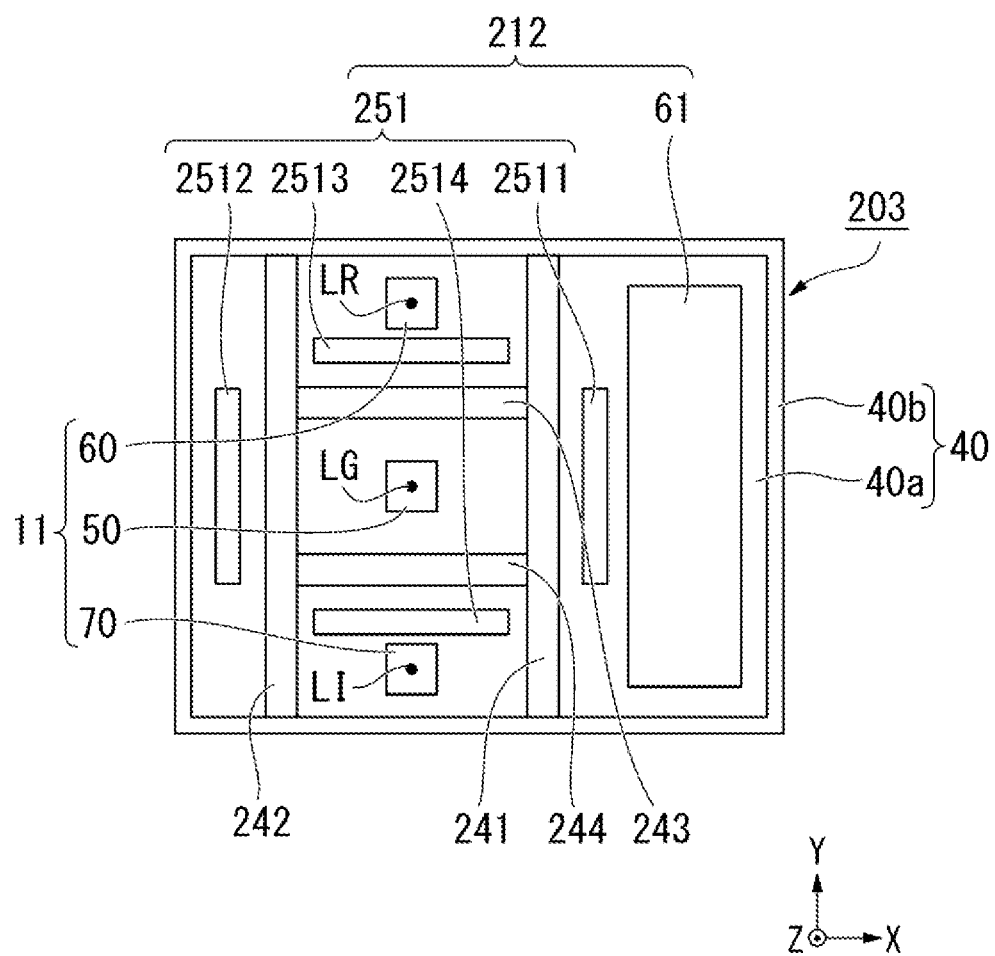
FIG. 9 is a cross-sectional view of a detecting device according to a third embodiment.

FIG. 9 is a cross-sectional view of a detecting device according to the present embodiment. FIG. 9 is a view illustrating a configuration corresponding to FIG. 3 in the first embodiment. Note that configurations and members common to the first embodiment will be given an identical reference numeral and detailed description thereof will be omitted.

As illustrated in FIG. 9, a light-receiving unit 212 in the detecting device 203 according to the present embodiment includes a first light-receiving section 251 and the second light-receiving section 61. The first light-receiving section 251 of the present embodiment includes a first light-receiving portion 2511, a second light-receiving portion 2512, a third light-receiving portion 2513, and a fourth light-receiving portion 2514.

The first light-receiving portion 2511 and the second light-receiving portion 2512 are disposed sandwiching the first light-emitting section 50 in the direction along the X-axis, while the third light-receiving portion 2513 and the fourth light-receiving portion 2514 are disposed sandwiching the first light-emitting section 50 in the direction along the Y-axis.

In the case of the present embodiment, the first light-receiving portion 2511 is provided on the +X side of the first light-emitting section 50, while the second light-receiving portion 2512 is provided on the −X side of the first light-emitting section 50. The third light-receiving portion 2513 is provided on the +Y side of the first light-emitting section 50, while the fourth light-receiving portion 2514 is provided on the −Y side of the first light-emitting section 50.

The first light-receiving portion 2511, the second light-receiving portion 2512, the third light-receiving portion 2513, and the fourth light-receiving portion 2514 each have a configuration similar to that of the light-receiving section 51 of the first embodiment, and differ only in size. Each of the light-receiving portions 2511 to 2514 has the same area. Each of the light-receiving portions 2511 to 2514 has an area obtained by dividing the first light-receiving section 51 of the first embodiment into four. Therefore, in the present embodiment, the total area of each of the light-receiving portions 2511 to 2514 is smaller than the area of the second light-receiving section 61. With the detecting device 203 according to the present embodiment, the first light-receiving section 251 is constituted using the light-receiving portions 2511 to 2514 that have low unit prices to reduce cost.

The detecting device 203 according to the present embodiment further includes a first light-shielding wall 241, a second light-shielding wall 242, a third light-shielding wall 243, and a fourth light-shielding wall 244.

The first light-shielding wall 241 is disposed between the light-emitting unit section 11 and the first light-receiving portion 2511 in the direction along the X-axis. The first light-shielding wall 241 is a flat plate-shaped member protruding from the bottom surface portion 40a to the +Z side and extending in the Y-axis direction. The first light-shielding wall 241 is a member having light-shielding properties for shielding light so as to prevent light emitted from the light-emitting unit section 11 from being directly incident on the first light-receiving portion 2511 or the second light-receiving section 61.

The second light-shielding wall 242 is disposed between the light-emitting unit section 11 and the second light-receiving portion 2512 in the direction along the X-axis. The second light-shielding wall 242 is a flat plate-shaped member protruding from the bottom surface portion 40a to the +Z side and extending in the Y-axis direction. The second light-shielding wall 242 is a member having light-shielding properties for shielding light so as to prevent light emitted from the light-emitting unit section 11 from being directly incident on the second light-receiving portion 2512.

The third light-shielding wall 243 is disposed between the first light-emitting section 50 and the third light-receiving portion 2513 in the direction along the Y-axis. The third light-shielding wall 243 is a flat plate-shaped member protruding from the bottom surface portion 40a to the +Z side and extending in the X-axis direction. The third light-shielding wall 243 is provided so as to couple the first light-shielding wall 241 and the second light-shielding wall 242. The third light-shielding wall 243 is a member having light-shielding properties for shielding light so as to prevent light emitted from the first light-emitting section 50 from being directly incident on the third light-receiving portion 2513.

In the case of the present embodiment, the third light-receiving portion 2513 is provided between the third light-shielding wall 243 and the second light-emitting section 60 in the direction along the Y-axis.

The fourth light-shielding wall 244 is disposed between the first light-emitting section 50 and the fourth light-receiving portion 2514 in the direction along the Y-axis. The fourth light-shielding wall 244 is a flat plate-shaped member protruding from the bottom surface portion 40a to the +Z side and extending in the X-axis direction. The fourth light-shielding wall 244 is provided so as to couple the first light-shielding wall 241 and the second light-shielding wall 242. The fourth light-shielding wall 244 is a member having light-shielding properties for shielding light so as to prevent light emitted from the first light-emitting section 50 from being directly incident on the fourth light-receiving portion 2514.

In the case of the present embodiment, the fourth light-receiving portion 2514 is provided between the fourth light-shielding wall 244 and the third light-emitting section 70 in the direction along the Y-axis.

The detecting device 203 according to the present embodiment includes the first light-shielding wall 241, the second light-shielding wall 242, the third light-shielding wall 243, and the fourth light-shielding wall 244, thereby dividing the housing space inside the case 40 into five.

The first light-receiving portion 2511 is provided to correspond to a light incident region on the +X side of the first light-emitting section 50 in which the green light LG emitted from the first light-emitting section 50 and transmitted through the living body is concentrated. The first light-receiving portion 2511 has one fourth of the area of the light-receiving section 51 of the first embodiment. In other words, the first light-receiving portion 2511 is capable of receiving substantially one fourth of the amount of light incident on the light incident region on the +X side of the first light-emitting section 50.

In the case of the present embodiment, the second light-receiving section 61 is moved to the −X side by as much as the first light-receiving portion 2511 is shrunk in width in the X direction, whereby increase in dimension in the X direction is restrained.

Note that the green light LG transmitted through the living body is also similarly concentrated on the −X side, the +Y side, and the −Y side of the first light-emitting section 50 to form respective light incident regions.

The second light-receiving portion 2512 is provided to correspond to a light incident region on the −X side of the first light-emitting section 50 formed by the green light LG emitted from the first light-emitting section 50 and transmitted through the living body. Similar to the first light-receiving portion 2511, the second light-receiving portion 2512 has one fourth of the area of the light-receiving section 51 of the first embodiment. In other words, the second light-receiving portion 2512 is capable of receiving substantially one fourth of the amount of light incident on the light incident region on the −X side of the first light-emitting section 50.

The third light-receiving portion 2513 is provided to correspond to a light incident region on the +Y side of the first light-emitting section 50 formed by the green light LG emitted from the first light-emitting section 50 and transmitted through the living body. The third light-receiving portion 2513 is capable of receiving substantially one fourth of the amount of light incident on the light incident region on the +Y side of the first light-emitting section 50.

The fourth light-receiving portion 2514 is provided to correspond to a light incident region on the −Y side of the first light-emitting section 50 formed by the green light LG emitted from the first light-emitting section 50 and transmitted through the living body. The fourth light-receiving portion 2514 is capable of receiving substantially one fourth of the amount of light incident on the light incident region on the −Y side of the first light-emitting section 50.

The total amount of light received at each of the light-receiving portions 2511 to 2514 is equal to the amount of light received by the light-receiving section 51 of the first embodiment. Therefore, according to the detecting device 203 according to the present embodiment, similar to the first embodiment, the green light LG can be efficiently received, and the device configuration can be downsized while cost is reduced.

Thus far, the present disclosure has been described based on the embodiments described above. However, the present disclosure is not limited to the above-described embodiments, and can be carried out in various aspects without departing from the spirit and scope of the present disclosure.

For example, in the above-described embodiments, a human is used as an example of a living body. However, the present disclosure is also applicable to measurement of biological information (e.g., pulse) of other animals.

Furthermore, for the above-described embodiments, an example is given of a case in which the first light-receiving section is constituted by two or four light-receiving elements. However, the number of light-receiving elements constituting the first light-receiving section is not limited to these. For example, the first light-receiving section may be constituted by three, five, or more light-receiving elements.

Furthermore, for the measuring device 100 according to the above-described embodiments, an example is given of a case in which the detecting device 3 is provided in the housing section 1. However, the installation location of the detecting device 3 is not limited to this. For example, the detecting device 3 may be embedded in the belt 2.

Furthermore, for the measuring device 100 according to the above-described embodiments, a wristwatch-type configuration is given as an example. However, the present disclosure is also applicable, for example, to a configuration in which a necklace-type measuring device 100 is mounted around the neck of the test subject, a configuration in which a seal-type measuring device 100 is attached to the body of the test subject, or a configuration in which a head-mounted display-type measuring device 100 is mounted on the head of the test subject.

Furthermore, for the above-described embodiments, an example is given of a case in which the band-pass filter 122 is provided only for the first light-receiving section 51. However, a band-pass filter that selectively transmits the red light LR or the near-infrared light LI may also be provided for the second light-receiving section 61.

Furthermore, for the detecting devices 3 and 103 according to the above-described embodiments, an example is given of a case in which each of the light-emitting sections 50, 60, and 70 is caused to emit light in time division. However, since the detecting devices 3 and 103 separately include the first light-receiving sections 51 and 151 corresponding to the green light LG of the light-emitting section 50, respectively, the light-emitting section 50 may be turned on constantly rather than in time division.

A detecting device according to one aspect of the present disclosure may have the following configuration.

A detecting device according to one aspect of the present disclosure includes: a first light-emitting section configured to emit first light having a green wavelength band; a second light-emitting section configured to emit second light having a wavelength band longer than the green wavelength band; a first light-receiving section configured to receive the first light emitted from the first light-emitting section and emitted from a living body; and a second light-receiving section configured to receive the second light emitted from the second light-emitting section and emitted from the living body; when a direction in which the first light-emitting section and the second light-emitting section are aligned is a first direction and a direction intersecting the first direction is a second direction, in the second direction, at least a portion of the first light-receiving section being disposed closer to the first light-emitting section than the second light-receiving section and an area of the first light-receiving section being smaller than an area of the second light-receiving section.

The detecting device according to one aspect of the present disclosure may have a configuration in which the first light-receiving section includes a band-pass filter configured to selectively transmit the first light.

The detecting device according to one aspect of the present disclosure may have a configuration in which the first light-receiving section includes a first sensor section configured to receive the first light and a first angle-limiting filter configured to limit an incident angle of the first light reaching the first sensor section and the second light-receiving section includes a second sensor section configured to receive the second light and a second angle-limiting filter configured to limit an incident angle of the second light reaching the second sensor section.

The detecting device according to one aspect of the present disclosure may have a configuration in which the detecting device further includes a flat plate-shaped light-shielding wall provided between the first light-emitting section and the first light-receiving section and configured to block at least a portion of the first light.

The detecting device according to one aspect of the present disclosure may have a configuration in which the first light-receiving section includes a single light-receiving element and a width of the first light-receiving section in the second direction is smaller than a width of the second light-receiving section in the second direction.

The detecting device according to one aspect of the present disclosure may have a configuration in which the first light-receiving section includes a first light-receiving portion and a second light-receiving portion and the first light-receiving portion and the second light-receiving portion are disposed sandwiching the first light-emitting section in the second direction.

The detecting device according to one aspect of the present disclosure may have a configuration in which a total area of the first light-receiving portion and the second light-receiving portion is smaller than an area of the second light-receiving section.

The detecting device according to one aspect of the present disclosure may have a configuration in which the first light-receiving section includes a first light-receiving portion, a second light-receiving portion, a third light-receiving portion, and a fourth light-receiving portion, the first light-receiving portion and the second light-receiving portion are disposed sandwiching the first light-emitting section in the second direction, the third light-receiving portion and the fourth light-receiving portion are disposed sandwiching the first light-emitting section in the first direction, a flat plate-shaped first light-shielding wall is provided between the first light-emitting section and the first light-receiving portion, the flat plate-shaped first light-shielding wall being configured to block at least a portion of the first light, a flat plate-shaped second light-shielding wall is provided between the first light-emitting section and the second light-receiving portion, the flat plate-shaped second light-shielding wall being configured to block at least a portion of the first light, a flat plate-shaped third light-shielding wall is provided between the first light-emitting section and the third light-receiving portion, the flat plate-shaped third light-shielding wall being configured to block at least a portion of the first light, and a flat plate-shaped fourth light-shielding wall is provided between the first light-emitting section and the fourth light-receiving portion, the flat plate-shaped fourth light-shielding wall being configured to block at least a portion of the first light.

The detecting device according to one aspect of the present disclosure may have a configuration in which a total area of the first light-receiving portion, the second light-receiving portion, the third light-receiving portion, and the fourth light-receiving portion is smaller than an area of the second light-receiving section.

The detecting device according to one aspect of the present disclosure may have a configuration in which the detecting device further includes: a third light-emitting section configured to emit third light; wherein the third light emitted from the third light-emitting section and emitted from the living body is received by the second light-receiving section, the third light-receiving portion is provided between the third light-shielding wall and the second light-emitting section in the first direction, and the fourth light-receiving portion is provided between the fourth light-shielding wall and the third light-emitting section in the first direction.

A measuring device according to one aspect of the present disclosure may have the following configuration.

A measuring device according to one aspect of the present disclosure includes a detecting device according to any one of the above-described aspects; and an information analysis section configured to identify biological information from a detection signal indicating a detection result by the detecting device.

What is claimed is:
1. A detecting device comprising:
a first light-emitting section configured to emit first light having a green wavelength band;
a second light-emitting section configured to emit second light having a wavelength band longer than the green wavelength band;
a first light-receiving section configured to receive the first light emitted from the first light-emitting section and emitted from a living body; and
a second light-receiving section configured to receive the second light emitted from the second light-emitting section and emitted from the living body, wherein
when a direction in which the first light-emitting section and the second light-emitting section are aligned is a first direction and a direction intersecting the first direction is a second direction, in the second direction, at least a portion of the first light-receiving section is disposed closer to the first light-emitting section than the second light-receiving section,
a width of the first light-receiving section in the second direction is smaller than a width of the second light-receiving section in the second direction, a length of the first light-receiving section in the first direction is same as a length of the second light-receiving section in the first direction, and an area of the first light-receiving section is smaller than an area of the second light-receiving section.

2. The detecting device according to claim 1, wherein the first light-receiving section includes a band-pass filter configured to selectively transmit the first light.

3. The detecting device according to claim 1, wherein the first light-receiving section includes
a first sensor section configured to receive the first light and
a first angle-limiting filter configured to limit an incident angle of the first light reaching the first sensor section, and
the second light-receiving section includes
a second sensor section configured to receive the second light and
a second angle-limiting filter configured to limit an incident angle of the second light reaching the second sensor section.

4. The detecting device according to claim 1, further comprising a flat plate-shaped light-shielding wall provided between the first light-emitting section and the first light-receiving section and configured to block at least a portion of the first light.

5. The detecting device according to claim 1, wherein the first light-receiving section includes a single light-receiving element, and
the area of the first light-receiving section is substantially half of the area of the second light-receiving section.

6. The detecting device according to claim 1, wherein the first light-receiving section includes
a first light-receiving portion and
a second light-receiving portion,
the first light-receiving portion and the second light-receiving portion are disposed sandwiching the first light-emitting section in the second direction,
a sum of a width of the first light-receiving portion and a width of the second light-receiving portion in the second direction is the width of the first light-receiving section in the second direction, and
a length of the first light-receiving portion in the first direction, a length of the second light-receiving portion in the first direction are the same as the length of the second light-receiving section in the first direction.

7. A detecting device comprising:
a first light-emitting section configured to emit first light having a green wavelength band;
a second light-emitting section configured to emit second light having a wavelength band longer than the green wavelength band;
a first light-receiving section configured to receive the first light emitted from the first light-emitting section and emitted from a living body; and
a second light-receiving section configured to receive the second light emitted from the second light-emitting section and emitted from the living body, wherein
when a direction in which the first light-emitting section and the second light-emitting section are aligned is a first direction and a direction intersecting the first direction is a second direction,
in the second direction, at least a portion of the first light-receiving section is disposed closer to the first light-emitting section than the second light-receiving section,
an area of the first light-receiving section is smaller than an area of the second light-receiving section, and
the first light-receiving section includes
a first light-receiving portion and
a second light-receiving portion, and
the first light-receiving portion and the second light-receiving portion are disposed sandwiching the first light-emitting section in the second direction,
wherein a total area of the first light-receiving portion and the second light-receiving portion is smaller than an area of the second light-receiving section.

8. A detecting device comprising:
a first light-emitting section configured to emit first light having a green wavelength band;
a second light-emitting section configured to emit second light having a wavelength band longer than the green wavelength band;
a first light-receiving section configured to receive the first light emitted from the first light-emitting section and emitted from a living body; and
a second light-receiving section configured to receive the second light emitted from the second light-emitting section and emitted from the living body, wherein
when a direction in which the first light-emitting section and the second light-emitting section are aligned is a first direction and a direction intersecting the first direction is a second direction,
in the second direction, at least a portion of the first light-receiving section is disposed closer to the first light-emitting section than the second light-receiving section,
an area of the first light-receiving section is smaller than an area of the second light-receiving section,
the first light-receiving section includes
a first light-receiving portion,
a second light-receiving portion,
a third light-receiving portion, and
a fourth light-receiving portion, wherein
the first light-receiving portion and the second light-receiving portion are disposed sandwiching the first light-emitting section in the second direction,
the third light-receiving portion and the fourth light-receiving portion are disposed sandwiching the first light-emitting section in the first direction,
a flat plate-shaped first light-shielding wall is provided between the first light-emitting section and the first light-receiving portion, the flat plate-shaped first light-shielding wall being configured to block at least a portion of the first light,
a flat plate-shaped second light-shielding wall is provided between the first light-emitting section and the second light-receiving portion, the flat plate-shaped second light-shielding wall being configured to block at least a portion of the first light,
a flat plate-shaped third light-shielding wall is provided between the first light-emitting section and the third light-receiving portion, the flat plate-shaped third light-shielding wall being configured to block at least a portion of the first light,
a flat plate-shaped fourth light-shielding wall is provided between the first light-emitting section and the fourth light-receiving portion, the flat plate-shaped fourth light-shielding wall being configured to block at least a portion of the first light, and a total area of the first light-receiving portion, the second light-receiving portion, the third light-receiving portion, and the fourth light-receiving portion is smaller than an area of the second light-receiving section.

9. The detecting device according to claim 8, further comprising:

a third light-emitting section configured to emit third light, wherein the third light emitted from the third light-emitting section and emitted from the living body is received by the second light-receiving section, the third light-receiving portion is provided between the third light-shielding wall and the second light-emitting section in the first direction, and the fourth light-receiving portion is provided between the fourth light-shielding wall and the third light-emitting section in the first direction.

10. A measuring device, comprising:

a detecting device according to claim 1; and an information analysis section configured to identify biological information from a detection signal indicating a detection result by the detecting device.

* * * * *